United States Patent [19]
Hayashi

[11] Patent Number: 5,898,344
[45] Date of Patent: Apr. 27, 1999

[54] HIGH-FREQUENCY MODULE

[75] Inventor: Katsuhiko Hayashi, Chiba, Japan

[73] Assignee: TDK Corporation, Tokyo, Japan

[21] Appl. No.: 08/816,736

[22] Filed: Mar. 14, 1997

[30] Foreign Application Priority Data

Mar. 14, 1996 [JP] Japan .................................. 8-057135
Jan. 7, 1997 [JP] Japan .................................. 9-000725

[51] Int. Cl.$^6$ ........................................................ H03B 1/00
[52] U.S. Cl. .......................................... 331/67; 333/185
[58] Field of Search ................................ 333/185; 331/67, 331/96, 117 D, 107 SL

[56] References Cited

U.S. PATENT DOCUMENTS 5,172,077 12/1992 Funada ............................ 331/67
5,661,441 8/1997 Morino et al. ................... 331/117 D
5,726,612 3/1998 Mandai et al. .................. 333/185

FOREIGN PATENT DOCUMENTS

0 437 313 7/1991 European Pat. Off. .

Primary Examiner—Gary Paumen
Attorney, Agent, or Firm—Oblon, Spivak, McClelland, Maier & Neustadt, P.C.

[57] ABSTRACT

Downward projections made on two side walls of a cap are fitted into recesses in two opposed side faces of a substrate. Lower margins of two end walls of the cap are soldered to ground electrodes provided on a part mounting face of the substrate. Lower margins in the proximity of projections of the side walls of the cap are soldered to ground electrodes provided on the part mounting face above recesses of the substrate. Therefore, it is provided a high-frequency module that can produce a good electromagnetic shielding effect even in a high-frequency band.

10 Claims, 6 Drawing Sheets

HIGH-FREQUENCY MODULE

BACKGROUND OF THE INVENTION

1. Field of the Invention

This invention relates to a high-frequency module such as a voltage-controlled oscillator (VCO), an antenna switch, etc., in fields of radio machines such as portable telephones and automobile telephones and any other communication machines and in particular to a high-frequency module put into a surface-mounted device (SMD) covered with a conductive cap for electromagnetic shielding.

2. Description of Conventional Art

Figure 10:
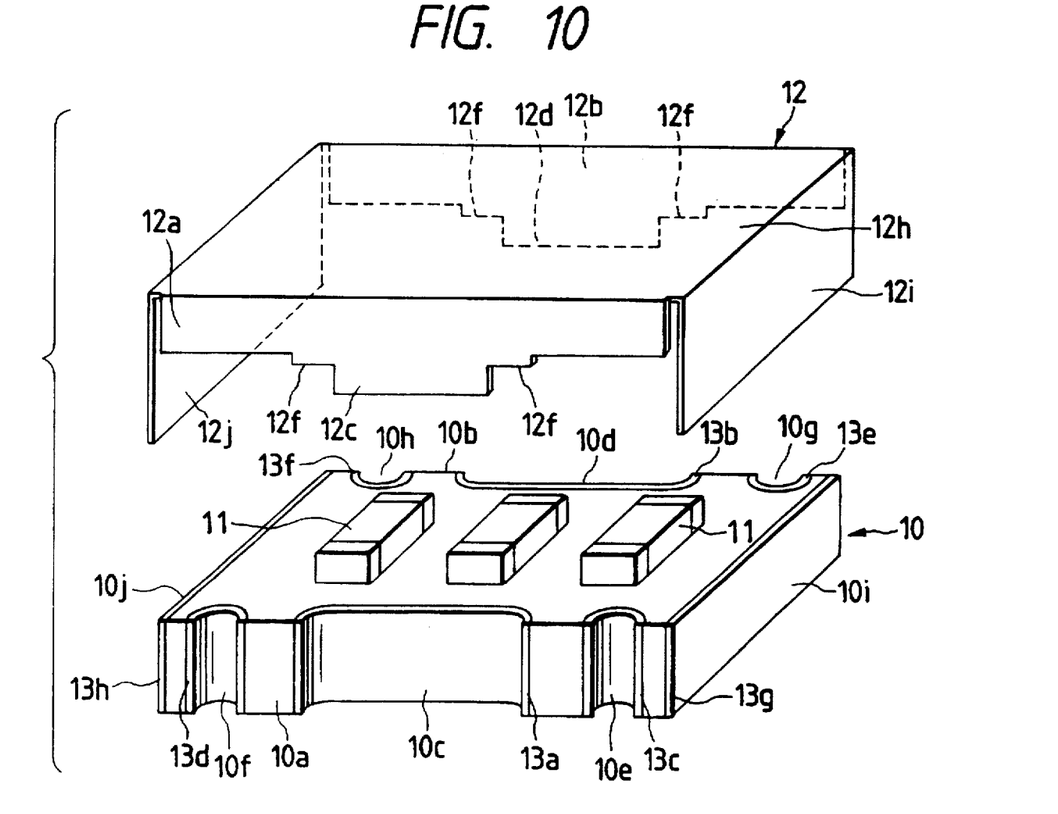
FIG. 10 is an exploded perspective view to show a conventional high-frequency module.
Figure 11:
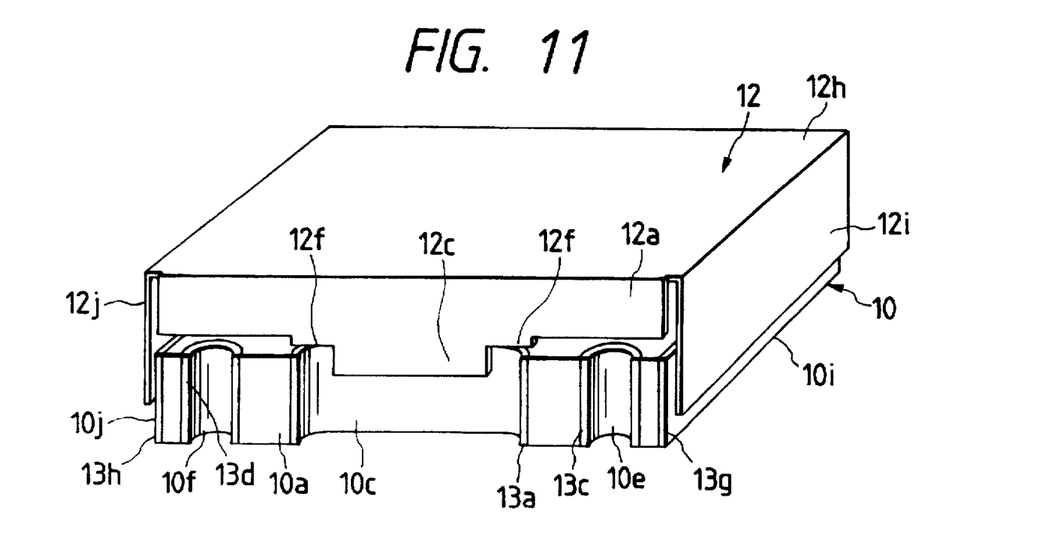
FIG. 11 is a perspective view of the conventional is high-frequency module in FIG. 10.

A high-frequency module of this kind having a substrate and mounted parts on the substrate covered with a conductive cap such as a metal cap is disclosed in Unexamined Japanese Patent Publication 4-328903. FIGS. 10 and 11 show a conventional high-frequency module drawn based on the high-frequency module described in Japanese Patent Publication 4-328903; FIG. 10 is an exploded perspective view to show the high-frequency module before the substrate and cap are assembled and FIG. 11 is a perspective view to show the high-frequency module after the substrate and cap are assembled.

In FIGS. 10 and 11, numeral 10 is a substrate on which electronic parts 11 are mounted and numeral 12 is a conductive cap made of metal, etc., for electromagnetic shielding and fixed to the substrate 10 so as to cover the substrate 10 and the electronic parts 11. Recesses 10c and 10d are formed at the centers of opposed side faces 10a and 10b of the substrate 10 respectively. Recesses 10e and 10f are formed on both sides of the recess 10c, and recesses 10g and 10h are formed on both sides of the recess 10d. Metal plating 13a–13f are given to the recesses 10c–10h. Among the recesses 10c–10h, the center recesses 10c and 10d are used as ground electrodes and the recesses 10e–10h on both sides of the recesses 10a and 10b are connected to the mounted parts 11 via a conductor pattern (not shown) for use as signal input/output terminals and a power supply terminal. Metal platings 13g and 13h are also given to end faces of the substrate 10 respectively for use as ground electrodes.

On the other hand, the cap 12 has an opened lower face, downward projections 12c and 12d fitted into the recesses 10c and 10d of the substrate 10 respectively are formed at the centers of side walls 12a and 12b corresponding to the side faces 10a and 10b of the substrate 10, and steps 12f abutted against the top face of the substrate 10 are made on both sides of the projections 12c and 12d. To attach the cap 12 to the substrate 10, as shown in FIG. 11, the projections 12c and 12d of the cap 12 are fitted into the recesses 10c and 10d of the side faces 10a and 10b of the substrate 10 and the steps 12f are abutted against the part mounting face of the substrate 10, thereby forming a space for housing the parts 11 between a top 12h of the cap 12 and the top face of the substrate 10, and end walls 12i and 12j of the cap 12 are abutted against the end faces 10i and 10j of the substrate 10. The projections 12c and 12d of the cap 12 are soldered to the ground electrodes 13a and 13b of the recesses 10c and 10d, and the end walls 12i and 12j of the cap 12 are soldered to the electrodes 13g and 13h of the end faces 10i and 10j of the substrate 10.

As shown in Unexamined Japanese Patent Publication 4-328903, a structure is also available wherein the projections 12c and 12d are only soldered to the recesses 10c and 10d without plating the end face 10i or 10j of the substrate 10, and the end faces 10i and 10j of the substrate 10 are simply is covered with the end walls 12i and 12j of the cap 12.

The conventional high-frequency module described above involves the following problem: The substrate 10 has a circuit pattern formed on the part mounting face and if necessary, on the rear face using a print technology and photography regardless of whether it is made of a lamination-type ceramic containing devices or a resin substrate; the substrates 10 are mass produced from single substrates each comprising a large number of separate substrates, which will be hereinafter called source substrates.

Thus, to give metal plating to the four surrounding faces 10a, 10b, 10i, and 10j of the substrate 10 as in the conventional high-frequency module, at least before the electronic parts 11 are mounted on the substrate 10, a source substrate needs to be divided into separate substrates 10 for applying metalization treatment such as plating to the four faces 10a, 10b, 10i, and 10j.

Thus, steps after metalization treatment is executed for the four faces 10a, 10b, 10i, and 10j of the substrate 10, namely, steps of inputting substrates into each treatment device of a manufacturing line, performing solder paste printing, mounting the electronic parts 11, passing through a reflow oven for soldering the electronic parts 11, taking cut the substrates, etc., must be performed for each substrate 10. Since the steps after the metalization treatment are thus executed for each substrate 10, the throughput decreases sharply as compared with treatment on source substrates. In addition, quantity check and alignment of orientation of the substrates 10 become required at the intermediate stage between steps in a manufacturing process of the substrates 10, increasing the number of steps rapidly, worsening the throughput, and increasing the manufacturing costs of the high-frequency modules.

On the other hand, if a structure wherein metalization treatment is not executed for the end face 10i or 10j of the substrate 10, namely, a structure free of soldering is adopted, the steps of inputting substrates into each treatment device of a manufacturing line, performing solder paste printing, mounting the electronic parts 11, passing through a reflow oven for soldering the electronic parts 11, taking out the substrates, etc., can be performed in batch for source substrates.

However, it has been revealed that the side walls 12a and 12b and the end walls 12i and 12j of the cap 12 which become ground potential must be electrically connected to the substrate 10 by soldering, etc., in order to stabilize oscillation signals in application of a voltage-controlled oscillator (VCO) as an example of the high-frequency module particularly in a high-frequency band exceeding 1 GHz. That is, if many portions are not electrically connected between the cap 12 and the substrate 10, signals in the high-frequency module leak and affect other circuits or unnecessary signals enter the high-frequency module from other circuits, so that the operation of the entire system (for example, a portable telephone) becomes unstable and the speech quality worsens.

To solve this problem, it is the most effective to solder the cap 12 to the side faces 10a and 10b and the end faces 10i, and 10j of the substrate 10 as described above. However, as mentioned above, if metalization treatment is also applied to the end faces 10i and 10j, metalization treatment for each end face 10i, 10j becomes necessary in addition to the above-mentioned steps for each substrate 10; fairly intricate steps become necessary. Further, to attempt to pursue the manufacturing efficiency, it is difficult to solder the four surrounding faces of the substrate 10 at the same time; it is hard to raise the manufacturing efficiency.

SUMMARY OF THE INVENTION

It is therefore an object of the invention to provide a high-frequency module manufactured as an inexpensive product by enabling mounting electronic parts and reflow soldering in a source substrate state for raising manufacturing efficiency.

It is another object of the invention to provide a high-frequency module that can produce a good electromagnetic shielding effect even in a high-frequency band.

To these ends, according to the invention, there is provided, in a high-frequency module comprising a rectangular substrate on which electronic parts are mounted and a conductive cap being attached to the substrate for electromagnetically shielding the substrate and the electronic parts, the improvement wherein the cap has a lower face opening structure comprising two side walls corresponding to two opposed side faces of the substrate, two end walls corresponding to two opposed end faces of the substrate, and a top, the cap having downward projections formed on the two side walls, wherein the substrate has recesses made in the two opposed side faces and conductors provided in the recesses serving as ground electrodes, the substrate having ground electrodes provided on a part mounting face at places adjoining the end faces of the substrate, and wherein the projections of the cap are fitted into the recesses in the side faces of the substrate and the lower margins of the two end walls of the cap are soldered to the ground electrodes provided on the part mounting face of the substrate.

The projections of the side walls of the cap are fitted into the recesses in the side faces of the substrate and the end walls of the cap are soldered to the ground electrodes provided on the part mounting face of the substrate, thereby attaching the cap to the substrate. Thus, metalization treatment of metal plating, etc., need not be executed for the end faces of the substrate. Therefore, a source substrate can undergo the steps of inputting the source substrate into various treatment devices, performing solder paste printing on the substrate, mounting parts, passing through a reflow oven, taking out substrates on which the parts have been mounted, etc. Solder paste is applied to the part mounting face of the substrate and the cap is put on the substrate, whereby the cap can be soldered. Thus, the high-frequency module manufacturing efficiency is improved.

The projections of the cap are fitted into the recesses of the substrate, whereby the cap can be positioned easily and reliably with respect to the substrate.

In the invention, in the high-frequency module as mentioned above, the projections of the side walls of the cap are soldered to the ground electrodes of the recesses in the side faces of the substrate.

The end walls of the cap are soldered to the ground electrodes on the part mounting face of the substrate and the projections of the cap are soldered to the ground electrodes of the recesses in the side faces of the substrate, thus electric connection to the cap is made in all directions of the substrate, so that the electromagnetic shelding effect in a high-frequency band can be enhanced.

According to the invention, there is provided, in a high-frequency module comprising a rectangular substrate on which electronic parts are mounted and a conductive cap being attached to the substrate for electromagnetically shielding the substrate and the electronic parts, the improvement wherein the cap has a lower face opening structure comprising two side walls corresponding to two opposed side faces of the substrate, two end walls corresponding to two opposed end faces of the substrate, and a top, the cap having downward projections formed on the two side walls, wherein the substrate has recesses made in the two opposed side faces and conductors provided in the recesses serving as ground electrodes, the substrate having ground electroded provided on a part mounting face at places adjoining the recesses in the side faces of the substrate, the ground electrodes being electrically connected to the ground electrodes provided in the recesses, and wherein the projections of the side walls of the cap are fitted into the recesses in the side faces of the substrate and the lower margins in the proximity of the projections of the side walls are soldered to the ground electrodes provided on the part mounting face adjoining the recesses of the substrate.

The projections of the side walls of the cap are fitted into the ground electrodes of the recesses in the side faces of the substrate and the lower margins in the proximity of the projections of the side walls are electrically connected and fixedly secured to the ground electrodes provided on the part mounting face adjoining the recesses of the substrate. Thus, a source substrate can undergo the steps of inputting the source substrate into various treatment devices, performing solder paste printing on the substrate, mounting parts, passing through a reflow oven, taking out Substrates on which the pars have been mounted, etc., and the high-frequency module manufacturing efficiency is improved.

If the side walls and the ground electrodes on the part mounting face are electrically connected by reflow soldering, molten solder infiltrates into gaps between the projections of the cap and the recesses, whereby the projections and the ground electrodes are soldered on their surfaces and can be strongly connected to each other.

In the invention, in the high-frequency module as mentioned above, the lower margins of the end walls of the cap are electrically connected and fixedly secured to the ground electrodes provided in the proximity of the end faces on the part mounting face of the substrate.

The side walls of the cap are soldered to the ground electrodes on the part mounting face of the substrate and the lower margins of the end walls of the cap are soldered to the ground electrodes provided in the proximity of the end faces on the part mounting face of the substrate, thus electric connection of the four surrounding faces of the substrate to the cap is made, so that the electromagnetic shielding effect in a high-frequency band can be enhanced.

In the invention, in the high-frequency module as mentioned above, a ground electrode opposed to the ground electrodes on the part mounting face is provided on the bottom face of the substrate and the ground electrode of the bottom face and the ground electrodes on the part mounting face are connected by conductors on the inner faces of through holes piercing the substrate.

A ground electrode opposed to the ground electrodes on the part mounting face adjoining the end faces is provided on the bottom face of the substrate and the ground electrode of the bottom face and the ground electrodes on the part mounting face are connected by the conductors on the inner faces of through holes piercing the substrate. Thus, the ground electrode of the bottom face together with the ground electrodes of the recesses in the side faces of the substrate can be connected to the ground electrodes on the mother board as a surface mounting structure and a good electromagnetic shielding effect can be produced in a high-frequency band exceeding 1 GHz, enabling the stable operation of the high-frequency module.

To solder the ground electrode of the bottom face of the substrate to the ground electrodes of the mother board, molten solder between the mother board and the substrate infiltrates into the hollows of the through holes, so that a phenomenon in which the high-frequency module floats up due to swell of solder can be avoided.

In the invention, in the high-frequency module as mentioned above, at least one notch is made in the lower margin of the end wall of the cap.

At least one notch is made in the lower margin of the end wall of the cap soldered to the ground electrode on the part mounting face of the substrate. Thus, at the soldering time, the surface tension of molten solder is dispersed in the notch and solder becomes easily deposited between the ground electrode and the cap, facilitating soldering.

In the invention, in the high-frequency module as mentioned above, the angle which the end wall of the cap forms with the top of the cap is made obtuse or acute.

The angle which the end wall of the cap forms with the top of the cap is made obtuse or acute. Thus, a state close to a state in which the end wall faces the ground electrode is provided as compared with the case where the angle is set to a right angle; when reflow soldering is executed, molten solder is attracted to the spaces between the end walls and the ground electrodes because of a surface tension, and can be prevented from flowing into the center of the substrate, namely, the electronic parts and a short-circuit can be avoided. If there is a slight dimension difference between the substrate and the cap, the end wall can be made to face or abut the ground electrode at least in a part, so that stable soldering can be executed.

BRIEF DESCRIPTION OF THE DRAWING

In the accompanying drawings.

DETAILED DESCRIPTION OF THE PREFERRED EMBODIMENT

Figure 1:
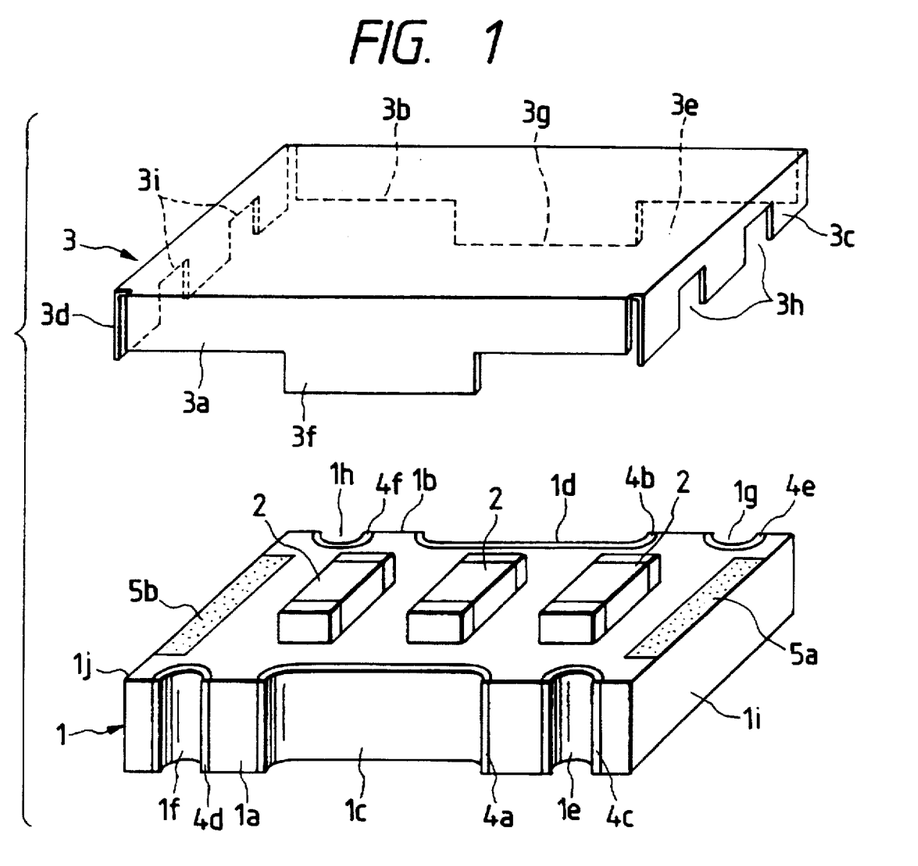
FIG. 1 is an exploded perspective view to show one embodiment of a high-frequency module according to the invention.
Figure 2:
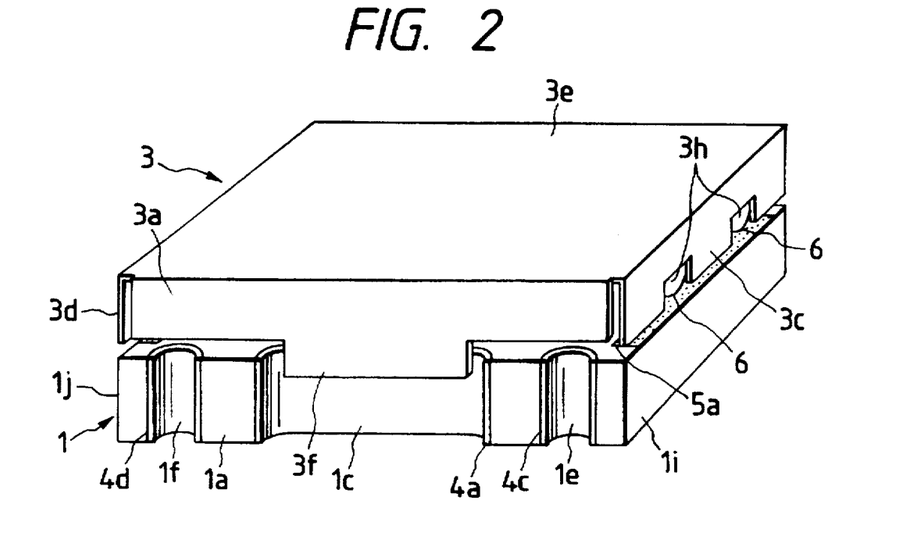
FIG. 2 is a perspective view of the high-frequency module of the embodiment in FIG. 1.
Figure 3:
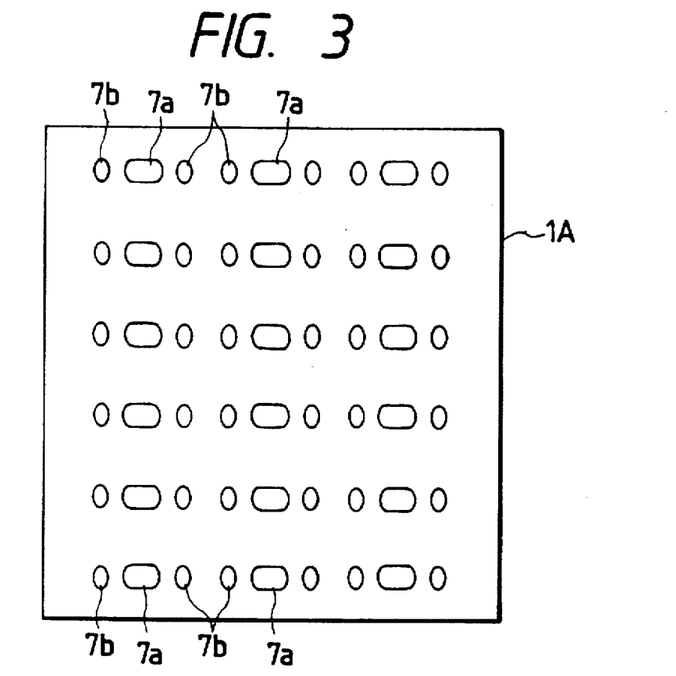
FIG. 3 is a plan view to show a source substrate used for the high-frequency module of the embodiment shown in FIGS. 1 and 2.
Figure 4:
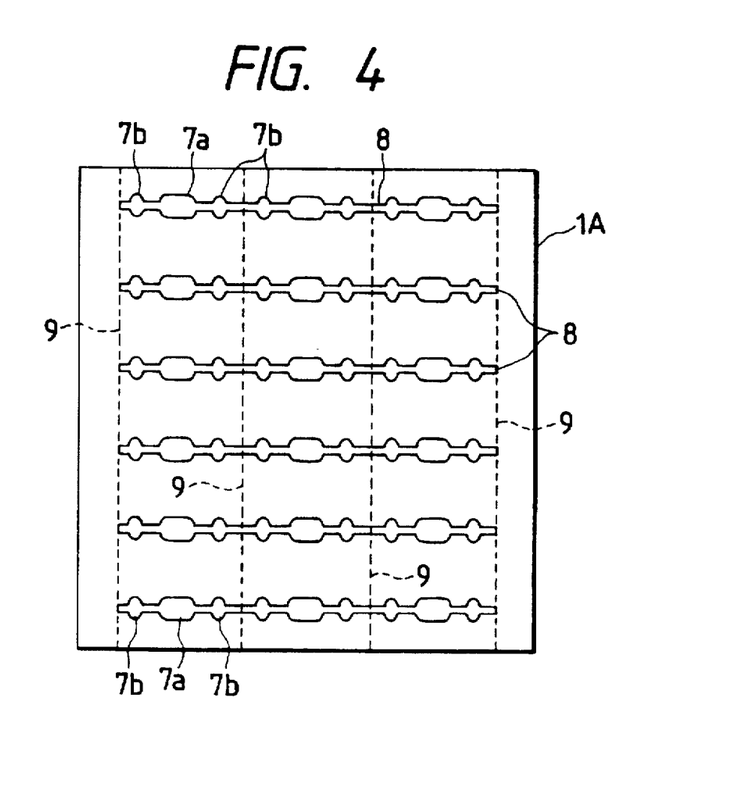
FIG. 4 is a plan view to show a state after division grooves are made in the source substrate in FIG. 3.

FIG. 1 is an exploded perspective view to show one embodiment of a high-frequency module according to the invention. FIG. 2 is a perspective view of the high-frequency module. FIGS. 3 and 4 are plan views to show a working process of a source substrate.

In FIGS. 1 and 2, numeral 1 is a substrate on which electronic parts 2 are mounted and numeral 3 is a conductive cap made of metal, etc., for electromagnetic shielding and fixed to the substrate 1 so as to cover the substrate 1 and the electronic parts 2. Recesses 1c and 1d are formed at the center of opposed side faces 1a and 1b of the substrate 1 respectively. Recesses 1e and 1f are formed on both sides of the recess 1c and recesses 1g and 1h are formed on both sides of the recess 1d. The recesses 1c–1h are formed with conductors by metal plating, etc., for use as electrodes 4a–4f. Among the recesses 1c–1h, the electrodes 4a and 4b of the center recesses 1c and 1d are used as ground electrodes and the electrodes 4c–4f of the recesses 1e–1h on both sides of the recesses 1a and 1b are connected to the mounted parts 2 via a conductor pattern (not shown) for use as signal input/output terminals and power supply terminal.

Ground electrodes 5a and 5b are provided at places adjoining substrate end faces 1i and 1j on the part mounting face of the substrate 1.

On the other hand, the cap 12 forms a lower-face opening structure consisting of two side walls 3a and 3b corresponding to the two opposed side faces 1a and 1b of the substrate 1, two end walls 3c and 3d corresponding to the two opposed end faces 1i and 1j of the substrate 1, and a cap 3e. Downward projections 3f and 3g fitted into the recesses 1c and 1d of the substrate 1 respectively are formed at the centers of the side walls 3a and 3b corresponding to the side faces 1a and 10 of the substrate 1.

To attach the cap 3 to the substrate 1, as shown in FIG. 2, the projections 3f and 3g of the cap 3 are fit into the recesses 1c and 1d of the side faces 1a and 1b of the substrate 1 for positioning and the end walls 3c and 3d are placed on the ground electrodes 5a and 5b and soldered, whereby the cap 3 is soldered to the ground electrodes 5a and 5b and is fixedly secured to the substrate 1. At the same time, a space is formed for housing the parts 2 between the top 3e of the cap 3 and the top face of the substrate 1. The projections 3f and 3g of the cap 3 are soldered to the ground electrodes of the recesses 1c and 1d.

This structure eliminates the need for forming electrodes by metal plating, etc., given to the end faces 1i and 1j of the substrate 1. Thus, steps of inputting a source substrate, performing solder paste printing, mounting parts, passing through a reflow oven, and taking out substrates on which the parts have been mounted can be executed in the source substrate state, as described below.

FIG. 3 is an example of source substrate 1A. A plurality of rows of as many sets of long hole 7a for forming the recesses 1c and 1d and hole 7b for forming the recesses 1e–1h on both sides of the recesses 1c and 1d as the number of substrates are made in the glass epoxy substrate 1A to which copper foil is bonded on both faces, and the inner faces of the holes 7a and 7b are plated with metal.

Next, an etching resist is applied to the full face of the source substrate 1A containing the inner faces of the holes 7a and 7b. Both faces of the source substrate 1A are exposed and developed by photography and the etching resist in portions other than the surface circuit patterns of high-frequency modules is removed. The source substrate 1A is immersed in an etchant, thereby removing the copper foil in portions other than the surface circuit patterns of high-frequency modules and completing wiring patterns of the high-frequency modules. After this, a solder resist is formed on the surface of the source substrate 1A according to a similar process to that described above. To promote solderability of part mounting pads on the wiring patterns of the high-frequency modules, solder coating is executed as required.

As shown in FIG. 4, chocolate-breakable division grooves 9 are made from both sides of the source substrate 1A, then grooves 8 smaller in width than the holes 7a and 7b are punched in the row direction of the holes 7a and 7b by using a metal mold.

Next, the electronic parts 2 required for providing the function of each high-frequency module are mounted on the source substrate 1A completed in the process. That is, the source substrate 1A undergoes a sequence of the steps of inputting the source substrate, performing solder paste printing, mounting parts, passing through a reflow oven, taking out substrates on which the parts have been mounted, etc. After the completion of mounting the parts, the source substrate 1A is divided into separate substrates 1.

The substrate 1 on which the electronic parts 2 are mounted is covered with the cap 3 as shown in FIG. 1 and soldering is performed as follows: Solder paste is applied to the ground electrodes 5a and 5b formed on the part mounting face of the substrate 1 and the cap 3 is put on the substrate 1 so that the end walls 3c and 3d of the cap 3 abut the ground electrodes 5a and 5b respectively.

At this time, the projections 3f and 3g of the side walls 3a and 3b of the cap 3 are fitted into the recesses 1c and 1d in the side faces of the substrate 1, whereby the cap 3 is positioned with respect to the substrate 1 and the lower margins of the end walls 3c and 3d of the cap 3 automatically match the ground electrodes 5a and 5b; the lower margins of the end walls 3c and 3d can be abutted against the terminal electrodes 5a and 5b easily and reliably.

Next, the substrate 1 covered with the cap 3 is passed through a solder reflow oven for soldering the substrate 1 and the cap 3. At this time, if at least one notch 3h, 3i is made in the end wall 3c, 3d of the cap 3 as shown in FIGS. 1 and 2, when the end walls 3c and 3d are soldered to the ground electrodes 5a and 5b on the part mounting face of the substrate 1, solder 6 melting on the ground electrodes 5a and 5b of the substrate 1 swells along the end margins of the notches 3h and 3i in the end walls 3c and 3d, promoting solderability. (See FIG. 7.) If the notches 3h and 3i are made, swelling of the solder 6 is observed, thus the soldering state can be checked easily at the mass production time. In the embodiment, two notches 3h and two notches 3i are made in the end walls 3c and 3d respectively, but the positions, the size, or the number of the notches 3h, 3i is determined by the relationship between the soldering state and the high-frequency module properties such as the size of the high-frequency module.

Last, the projections 3f and 3g of the cap 3 are soldered to the ground electrodes 4a and 4b of the recesses 1c and 1d in the side faces of the substrate 1 with a soldering iron, etc. High-frequency modules each with the cap 3 soldered from all directions of the substrate 1 are now complete.

In the embodiment, the high-frequency module that can operate stably in a high-frequency band exceeding 1 GHz can be provided by soldering the cap 3 to the substrate 1 from all directions thereof. However, if the high-frequency module is not used in ouch a high-frequency band, it may be unnecessary to solder the cap 3 from all directions. In this case, the projections 3f and 3g of the cap 3 are formed so as to come in intimate contact with the ground electrodes 4a and 4b in the side faces of the substrate 1, thus they are not soldered, and the ground electrodes 5a and 5b on the substrate 1 and the end walls 3c and 3d of the cap 3 are only soldered.

To automate soldering of the ground electrodes 4a and 4b in the side faces of the substrate 1 and the projections 3f and 3g of the cap 3, robots, etc., need to be installed, leading to expensive facilities. In comparison with it, to solder the ground electrodes 5a and 5b on the substrate 1 and the end walls 3c and 3d of cap 3, the substrate needs only to be passed through the solder reflow oven, thus there is an advantage of fast treatment in large quantities in a simple process.

Figure 5:
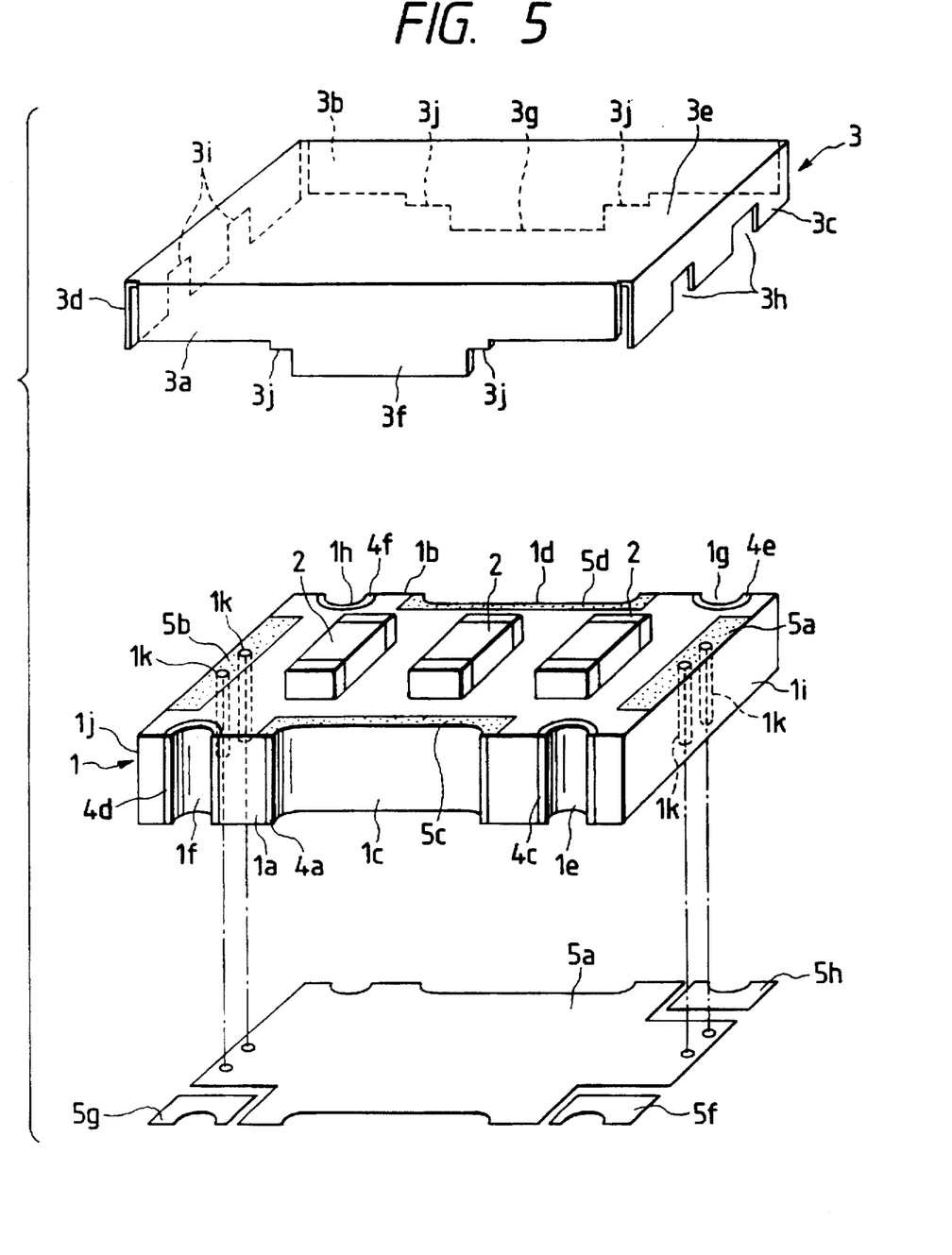
FIG. 5 is an exploded perspective view to show another embodiment of a high-frequency module according to the invention.
Figure 6:
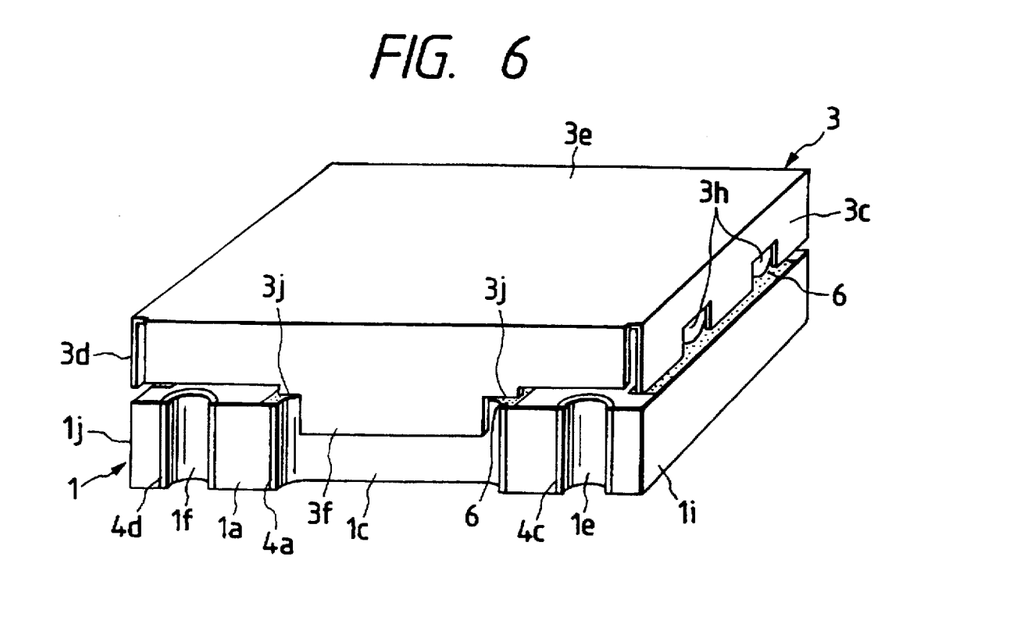
FIG. 6 is a perspective view of the high-frequency module of the embodiment in FIG. 5.
Figure 7:
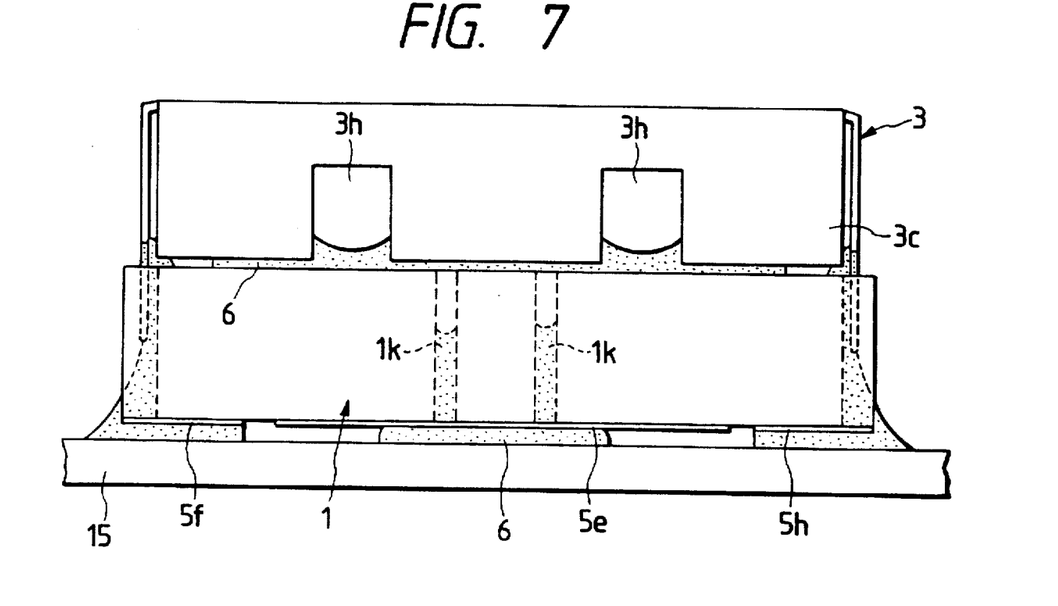
FIG. 7 is a view from the side of an end wall of a cap to show a state in which the high-frequency module of the embodiment in FIGS. 5 and 6 is mounted on a mother board.

FIG. 5 is an explode perspective view to show another embodiment of a high-frequency module according to the invention. FIG. 6 is a perspective view of the high-frequency module of the embodiment. FIG. 7 is a view from the side of end wall 3c of cap 3 to show a state in which the high-frequency module of the embodiment is mounted on the surface of a mother board.

In the embodiment, ground electrodes 5a and 5b are provided at places adjoining substrate end faces 1i and 1j on the part mounting face of a substrate 1 and ground electrodes 5c and 5d electrically connected to ground electrodes 4a and 4b disposed in recesses 1c and 1d are provided on the part mounting face of the substrate 1. In the embodiment, to fix a cap 3 to the substrate 1, as in the previous embodiment, projections 3f and 3g of side walls 3a and 3b are fitted into the recesses 1c and 1d in the side faces of the substrate 1 and the lower margins of end walls 3c and 3d of the cap 3 are fixedly secured to the ground electrodes 5a and 5b by solder 6. Further, in the embodiment, lower margins 3j stepped in the proximity of the projections 3f and 3g of the side walls 3a and 3b of the cap 3 are soldered to the ground electrodes 5c and 5d disposed on the part mounting face on the recesses 1c and 1d of the substrate 1.

As shown in FIG. 5, on the bottom of the substrate 1, a ground electrode 5e made of copper foil for forming external connection terminals for grounding is disposed connecting to electrodes 4a, 4b, and 4f of recesses 1c, 1d, and 1h. The ground electrode 5e on the bottom of the substrate 1 is electrically connected to the ground electrodes 5a and 5b on the part mounting face by conductors of inner faces of through holes 1k. The external connection terminals for grounding are formed in portions of the bottom face of the ground electrode 5e to which a solder resist is not applied. More particularly, the external connection terminals for grounding are formed in the proximity of the recesses 1c and 1d and in the surroundings of the through holes 1k. External connection terminals for signal or power supply, 5f–5h, are disposed electrically connecting to electrodes 4c, 4d, and 4e of recesses 1e, 1f, and 1g respectively.

The substrate 1 and the cap 3 in the high-frequency module of the embodiment are soldered as follows: First, solder paste is applied to the ground electrodes 5a–5d on the substrate 1 with a dispenser, etc. At this time, for the ground electrodes 5c and 5d, solder paste is applied only to the portions corresponding to the lower margins 3j stepped on both sides of the projections 3f and 3g of the cap 3, namely, only onto both ends of the ground electrodes 5c and 5d.

Next, the cap 3 is put on the substrate 1 to which the solder paste is applied. At this time, the projections 3f and 3g of the cap 3 are fitted into the recesses 1c and 1d of the substrate 1 for positioning, the lower margins of the end walls 3c and 3d abut the ground electrodes 5a and 5b, and the lower margins 3j stepped on both sides of the projections 3f and 3g abut the ground electrodes 5c and 5d.

If the substrate 1 covered with the cap 3 is passed through a reflow oven, the substrate 1 and the cap 3 are soldered on the four surrounding faces of the substrate 1 relative to the part mounting face of the substrate 1. When the substrate 1 covered with the cap 3 is passed through the reflow oven, the solder paste applied onto both ends of the ground electrodes 5c and 5d melts and infiltrates into a gap between the projection 3f of the cap 3 and the recess 1c and a gap between the projection 3g of the cap 3 and the recess 1d due to the solder surface tension, whereby the projections 3f and 3g and the ground electrodes 4a and 4b of the recesses 1c and 1d are soldered on their surfaces and can be strongly fitted and fixedly secured to each other in an ideal state.

This structure eliminates the need for forming electrodes in the end faces 1i and 1j of the substrate 1, as in the previous embodiment. Therefore, fixing of the cap 3 to the substrate 1 and electric connection thereof are performed by soldering the end walls 3c and 3d to the ground electrodes 5a and 5b and soldering the lower margins 3j stepped and the ground electrodes 5c and 5d, and a source substrate 1A can undergo a sequence of the steps of inputting the source substrate, performing solder paste printing, mounting parts, passing through a reflow oven, taking out substrates on which the parts have been mounted, etc., as in the previous embodiment, so that the production efficiency is improved. Even if metal plating is not given to the end face 1i or 1j of the substrate 1, electromagnetic shielding is provided on the four surrounding faces of the substrate 1 and an excellent electromagnetic shielding effect can be produced even in a high-frequency band exceeding 1 GHz, enabling the stable operation.

To produce a good electromagnetic shielding effect in a high-frequency band exceeding 1 GHz in the embodiment shown in FIGS. 1 and 2, the projections 3f and 3g must be soldered to the electrodes 4a and 4b of the recesses 1c and 1d. Thus, to automate soldering of the electrodes 4a and 4b in the side faces of the substrate 1 and the projections 3f and 3g of the cap 3, robots, etc., need to be installed, leading to expensive facilities. On the other hand, in the embodiment, to solder the ground electrodes 5a, 5b, 5c, and 5d on the substrate 1 and the end walls 3c and 3d and the side walls 3a and 3b of the cap 3, the substrate needs only to be passed through the solder reflow oven, thus there is an advantage of fast treatment in large quantities in a simple process.

As shown in FIG. 7, the ground electrodes 5a and 5b on the part mounting face of the substrate 1 are connected to the ground electrode 5e of the bottom face of the substrate 1 by the through holes 1k and the portions of the ground electrode 5e of the bottom face of the substrate 1 connected by the through holes 1k and their surroundings become exposed portions not covered with a solder resist, serving as external connection terminals. These external connection terminals are formed with electrodes only on the bottom face of the substrate and no electrodes on the and or side faces of the substrate 1. Normally, in a module provided with external connection terminals only on the bottom face of a substrate, solder is formed like a layer between the external connection terminals on the bottom face and a mother board 15, thus the module floats up on the mother board and floating-up of the module caused by solder easily introduces a problem in a product for which the module height containing the mounted part height is specified.

On the other hand, in the embodiment, the through holes 1k are made of open through holes having a hollow center, whereby to solder the external connection terminal for grounding 5e on the bottom face of the substrate 1 shown in FIG. 5 to the ground electrode of the mother board 15, older 6 melting between the mother board 15 and the substrate 1 infiltrates into the hollows of the through holes, so that the phenomenon in which the high-frequency module floats up due to swell of solder can be lessened and heightening of the high-frequency module more than the specified height can be avoided.

Since the ground electrodes 5a and 5b are connected to ground electrodes of the mother board 15 by the through holes 1k and the ground electrodes 4a and 4b of the recesses 1c and 1d are also connected to ground electrodes of the mother board 15, the high-frequency module of the embodiment can be connected to the mother board 15 in all directions and stabler operation is enabled in a high-frequency band exceeding 1 GHz.

Figure 8:
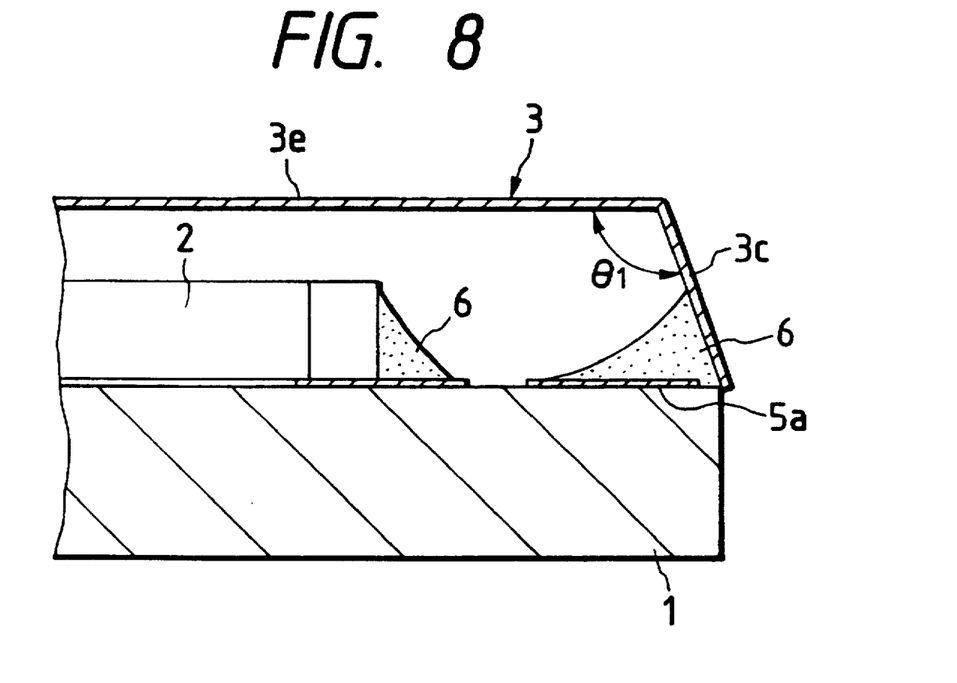
FIG. 8 is a sectional view to show another embodiment of a high-frequency module according to the invention.
Figure 9:
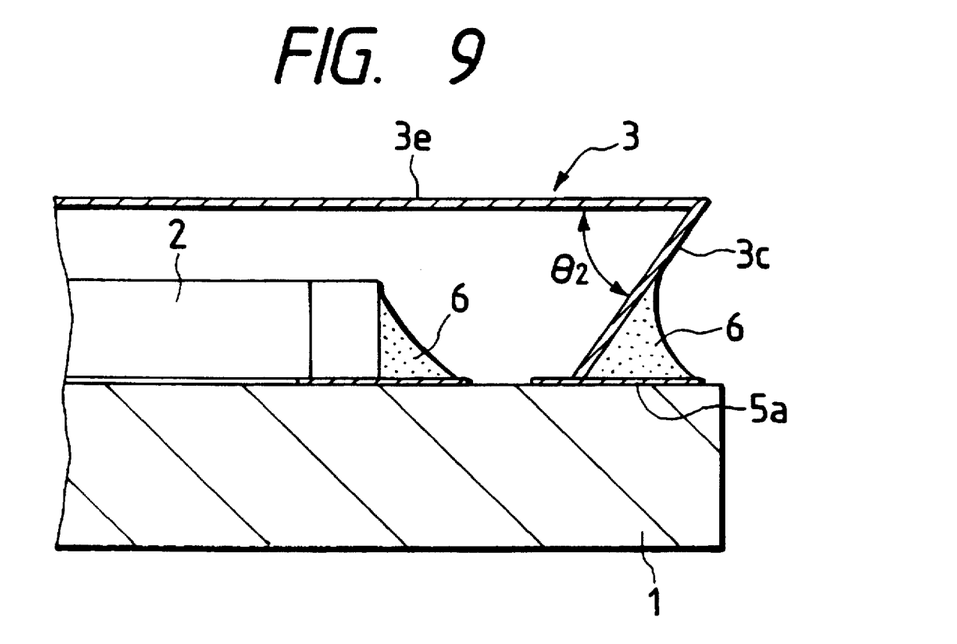
FIG. 9 is a sectional view to show another embodiment of a high-frequency module according to the invention.

In the invention, to solder the end walls 3c and 3d of the cap 3 to the ground electrodes 5a and 5b, a short-circuit easily occurs with the mounted parts near the ground electrode 5a, 5b on the substrate 1 at the mounting time. To prevent this, the end wall 3c, 3d of the cap 3 is formed so that the angle with the top 3e, θ1, becomes an obtuse angle as shown in FIG. 8, or an acute angle as shown as θ2 in FIG. 9. In the example in FIG. 8, the lower margins of the end walls 3c and 3d are abutted against the end margins of the part mounting face of the substrate 1. In FIG. 9, the lower margins of the end walls 3c and 3d are abutted against portions in the proximity of the inner ends of the ground electrodes 5a and 5b on the part mounting face of the substrate 1.

If the angle which the end wall 3c, 3d forms with the top 3e is thus made obtuse or acute, a state close to a state in which the end wall 3c, 3d faces the ground electrode 5a, 5b is provided as compared with the case where the angle is set to a right angle; when reflow soldering is executed, molten solder is attracted to the spaces between the end wall 3c and the ground electrode 5a and between 3d and 5b because of a surface tension, and can be prevented from flowing into the center of the substrate 1, namely, the electronic parts 2 and a short-circuit can be avoided. It there is a slight dimension difference between the substrate 1 and the cap 3, the end wall 3c, 3d can be made to face or abut the ground electrode 5a, 5b at least in a part, so that stable soldering can be executed.

We have discussed the inventions with the embodiments. The invention can also be embodied as follows:

(1) After the electronic parts 2 are mounted on the substrate 1, the cap 3 is soldered in a separate step in the embodiments. However, the cap 3 may be put on the substrate and soldered at the part mounting time.

(2) After the electronic parts 2 are mounted on the substrate 1, new solder paste is applied to the ground electrode 5a, 5b or 5c, 5d on the substrate 1 for soldering the cap 3 in the embodiments. However, when the electronic parts 2 are mounted, solder paste printing is also executed for the ground electrode 5a, 5b or 5c, 5d at the same time, the substrate is passed through the reflow oven, and the ground electrode 5a, 5b or 5c, 5d is precoated with solder. In this state, the cap 3 is put on the substrate 1 on which the electronic parts 2 have been mounted and the substrate 1 covered with the cap 3 can also be passed through the reflow oven for soldering.

(3) In the embodiment, there are provided two through holes 1k for connecting the ground electrode 5a on the part mounting face of the substrate 1 and the ground electrode 5e of the bottom face and two through holes 1k for connecting the ground electrode 5b and the ground electrode 5e. However, the number of through holes 1k should be determined matching the high-frequency shield characteristic of the high-frequency module. Therefore, if the adaptive frequency of the high-frequency module is comparatively low, about one through hole may be provided; if the adaptive frequency is comparatively high, two or more through holes may be provided.

(4) Although two notches 3h and two notches 3i of the end walls 3c and 3d of the cap 3 respectively are provided in the embodiment, the number, sizes, forms, and formation points of the notches 3h and 3i are changed in various ways depending on the scale of the high-frequency module and the soldering state.

As discussed in the above, according to the present invention, the projections of the side walls of the cap are fitted into the recesses in the side faces of the substrate and the end walls of the cap are soldered to the ground electrodes provided on the part mounting face of the substrate. Thus, metalization treatment of metal plating, etc., need not be executed for the end faces of the substrate having no recess. Therefore, a source substrate can undergo the steps of inputting the source substrate into various treatment devices, performing solder paste printing on the substrate, mounting parts, passing through a reflow oven, taking out substrates on which the parts have been mounted, etc. Solder paste is applied to the part mounting face of the substrate and the cap is put on the substrate, then the substrate covered with the cap is passed through the reflow oven, whereby the cap can be soldered. Thus, the high-frequency module manufacturing efficiency is improved, whereby the high-frequency module manufacturing costs can be decreased.

The projections of the cap are fitted into the recesses of the substrate, whereby the cap can be positioned easily and reliably with respect to the substrate; the product yield can be improved.

Further, the end walls of the cap are soldered to the ground electrodes on the part mounting face of the substrate and the projections of the cap are soldered to the ground electrodes of the recesses in the side faces of the substrate thus electric connection to the cap is made on the four surrounding faces of the substrate; the electromagnetic shielding effect in a high-frequency band exceeding 1 GHz can be enhanced, enabling the stable operation.

Furthermore, according to the present invention, the projections of the side walls of the cap are fitted into the ground electrodes of the recesses in the side faces of the substrate and the lower margins in the proximity of the projections of the side walls are electrically connected and fixedly secured to the ground electrodes provided on the part mounting face adjoining the recesses of the substrate. Thus, a source substrate can undergo the steps of inputting the source substrate into various treatment devices, performing solder paste printing on the substrate, mounting parts, passing through a reflow oven, taking out substrates on which the parts have been mounted, etc., and solder paste is applied to the part mounting face of the substrate and the cap is put on the substrate, then the substrate covered with the cap is passed through the reflow oven, whereby the cap can be soldered to the substrate. Thus, the high-frequency module manufacturing efficiency is improved, whereby the high-frequency module manufacturing costs can be decreased.

In electric connection of the side walls of the cap and the ground electrodes on the part mounting face by reflow soldering, solder paste applied onto the ground electrodes on the part mounting face melts at the reflow soldering time and infiltrates into gaps between the projections of the cap and the recesses, whereby the projections and the ground electrodes are soldered on their surfaces and can be strongly fixed and fixedly secured to each other, providing a high-frequency module high in reliability.

Furthermore, the side walls of the cap are soldered to the ground electrodes on the part mounting face of the substrate and the lower margins of the end walls of the cap are soldered to the ground electrodes provided in the proximity of the end faces on the part mounting face of the substrate, thus electric connection of the four surrounding faces of the substrate to the cap is made and the electromagnetic shielding effect in a high-frequency band exceeding 1 GHz can be enhanced.

In all electric connection parts formed by soldering the four surrounding faces of the substrate, solder paste is applied to the part mounting face of the substrate and the cap is put on the substrate, whereby the cap can be soldered. Thus, the high-frequency module manufacturing efficiency is improved and the high-frequency module having an excellent shield characteristic in a high-frequency band can be provided at a low price.

Furthermore, a ground electrode opposed to the ground electrodes on the part mounting face adjoining the end faces is provided on the bottom face of the substrate and the ground electrode of the bottom face and the ground electrodes on the part mounting face are connected by the conductors on the inner faces of through holes made piercing the substrate. Thus, the ground electrodes provided on the part mounting face of the substrate together with the ground electrodes of the recesses in the side faces of the substrate can be connected to the ground electrodes on the mother board as a surface mounting structure and a good electromagnetic shielding effect can be produced in a high-frequency band exceeding 1 GHz, enabling the stable operation of the high-frequency module.

To solder the ground electrode of the bottom face of the substrate to the ground electrode of the mother board, molten solder between the mother board and the substrate infiltrates into the hollows of the through holes, so what a phenomenon in which the high-frequency module floats up due to swell of solder can avoided.

Furthermore, at least one notch is made in the lower margin of the end wall of the cap soldered to the ground electrode on the part mounting face of the substrate. Thus, at the soldering time, molten solder becomes easily deposited in the notch, facilitating soldering.

Furthermore, the angle which the end wall of the cap forms with the top of the cap is made obtuse or acute. Thus, a state close to a state in which the end wall faces the ground electrode is provided as compared with the case where the angle is set to a right angle; when reflow soldering is executed, molten solder is attracted to the spaces between the end walls and the ground electrodes because of a surface tension, and can be prevented from flowing into the center of the substrate, namely, the electronic parts and a short-circuit can be avoided. If there is a slight dimension difference between the substrate and the cap, the end wall can be made to face or abut the ground electrode at least in a part, so that stable soldering can be executed and the soldering strength increases.

What is claimed is:

1. A high-frequency module comprising:
   a rectangular substrate having a part mounting face on which electronic parts are mounted, said substrate including at least two recesses formed in respective of two opposed side faces of the substrate and first ground electrodes formed in said recesses, second ground electrodes formed on the part mounting face at locations adjoining respective of two opposed end faces of said substrate; and a conductive cap attached to said substrate for electromagnetically shielding said substrate and the electronic parts, said cap including a lower face opening structure including two side walls corresponding to the two opposed side faces of said substrate, two end walls corresponding to the two opposed end faces of said substrate, and a top joined to the side walls and the end walls, said cap further having downward projections formed on respective of the two side walls;

wherein the projections of said cap are adapted to fit into the recesses in the opposed side faces of said substrate, and lower margins of the two end walls of said cap are soldered to the second ground electrodes formed on the part mounting face of said substrate.

2. The high-frequency module as claimed in claim 1 wherein the projections of the side walls of said cap are soldered to the ground electrodes formed in the recesses in the opposed side faces of said substrate.

3. A high-frequency module comprising:

a rectangular substrate having a part mounting face on which electronic parts are mounted, said substrate including at least two recesses formed in respective of two opposed side faces of the substrate, first ground electrodes formed in said recesses, and second ground electrodes formed on the part mounting face at locations adjoining the recesses formed in the opposed side faces of said substrate, said second ground electrodes being electrically connected to respective of the first ground electrodes formed in the recesses; and a conductive cap attached to said substrate for electromagnetically shielding said substrate and the electronic parts, said cap including a lower face opening structure including two side walls corresponding to the two opposed side faces of said substrate, two end walls corresponding to two opposed end faces of said substrate, and a top joined to the side walls and the end walls, said cap further having downward projections formed on respective of the two side walls;

wherein the projections of the side walls of said cap are adapted to fit into the recesses in the side faces of said substrate, and lower margins of the side walls are soldered to respective of the second ground electrodes formed on the part mounting face and adjoining the recesses of said substrate.

4. The high-frequency module as claimed in claim 3, wherein lower margins of the end walls of said cap are soldered to third ground electrodes provided in the proximity of the end faces on the part mounting face of said substrate.

5. The high-frequency module as claimed in claim 1, wherein a fourth ground electrode opposed to the second ground electrodes on the part mounting face is provided on a bottom face of said substrate, said fourth ground electrode on the bottom face and said second ground electrodes on the part mounting face being connected by conductors on inner faces of through holes piercing said substrate.

6. The high-frequency module as claimed in claim 1, wherein at least one notch is made in the lower margin of one of the end walls of said cap.

7. The high-frequency module as claimed in claim 1, wherein an angle which the end wall of said cap forms with the top of said cap is obtuse or acute.

8. The high-frequency module as claimed in claim 4, wherein a fourth ground electrode opposed to the second ground electrodes on the part mounting face is provided on a bottom face of said substrate, said fourth ground electrode of the bottom face and said second ground electrodes on the part mounting face being connected by conductors on inner faces of through holes made piercing said substrate.

9. The high-frequency module as claimed in claim 4, wherein at least one notch is made in the lower margin of one of the end walls of said cap.

10. The high-frequency module as claimed in claim 4, wherein an angle which the end wall of said cap forms with the top of said cap is obtuse or acute.

* * * * *